United States Patent [19]

Yamaguchi et al.

[11] 4,427,949

[45] Jan. 24, 1984

[54] SIGNAL INTERCEPTING CIRCUIT

[75] Inventors: Hiroyasu Yamaguchi; Yasuhiro Kodera, both of Yokohama, Japan

[73] Assignee: Tokyo Shibaura Denki Kabushiki Kaisha, Kanagawa, Japan

[21] Appl. No.: 290,094

[22] Filed: Aug. 4, 1981

[30] Foreign Application Priority Data

Aug. 18, 1980 [JP] Japan ................................ 55-129473

[51] Int. Cl.$^3$ ........................... H03F 1/14; H03F 3/45
[52] U.S. Cl. ...................................... 330/51; 330/252
[58] Field of Search ................. 330/252, 254, 257, 51, 330/207 P, 298

[56] References Cited

U.S. PATENT DOCUMENTS 3,875,522  4/1975  Hoefi .................................... 330/254

Primary Examiner—James B. Mullins
Assistant Examiner—Gene Wan
Attorney, Agent, or Firm—Schuyler, Banner, Birch, McKie & Beckett

[57] ABSTRACT

The muting circuit of the present invention comprises a first and second differential amplifier. The first differential amplifier comprises first and second transistors. The base electrode of the first transistor receives an input signal. The second differential amplifier comprises third and fourth transistors. The collector electrode of the third transistor is connected to the collector electrode of the second transistor, while the collector electrode of the fourth transistor is connected to the collector electrode of the first transistor. A switching circuit, receiving an intercepting signal, is coupled to the first and second differential amplifier. In the absence of an intercepting signal, the switching circuit causes the conduction of the first differential amplifier, and while cutting off the second differential amplifier. Upon receiving an intercepting signal, the switching circuit cuts off the first differential amplifier while it causes the conduction of second differential amplifier. Furthermore, the switching circuit causes the simultaneous conduction of the first and second differential amplifiers during a rising time and falling time of the intercepting signal. A D.C. fluctuation in the output voltage is produced during the time one amplifier is being activated while the other is being cut off. The simultaneous operation of both differential circuits prevents D.C. fluctuations in input voltage supplied to an output transistor. Consequently, the D.C. output potential of an output amplifier does not substantially fluctuate irrespective of the intercepting operation.

3 Claims, 3 Drawing Figures

SIGNAL INTERCEPTING CIRCUIT

BACKGROUND OF THE INVENTION

This invention relates to a signal intercepting circuit and particularly, to a muting circuit for intercepting an audio signal supplied to a loudspeaker in an audio amplifying circuit in a radio, such as a stereophonic receiving apparatus, or a television receiver.

In an audio amplifying circuit, a muting circuit is used to temporarily prevent an audio signal from being supplied to the loudspeaker when a power supply switch is turned on, or when the band selecting or STEREO MONO selecting switches is changed.

A muting circuit of the prior art is shown in FIG. 1. An audio signal is supplied to an input terminal 11. Terminal 11 is connected, through a resistor $R_{11}$, to the base electrode of a transistor $Q_{11}$. The base electrode of transistor $Q_{11}$ is also grounded through a resistor $R_{13}$. Its collector electrode is grounded and its emitter electrode is connected to the emitter electrode of a transistor $Q_{12}$. The collector electrode of transistor $Q_{12}$ is connected to an output terminal 14 through an amplifier 12. The base electrode of transistor $Q_{12}$ is connected, through a negative feedback resistor $R_{12}$, to output terminal 14 and to ground through serially connected condenser $C_{11}$ and resistor $R_{14}$. Output terminal 14 is connected to a loudspeaker (not shown). Further, the collector electrode of a muting transistor $Q_{13}$ is connected to the base electrode of transistor $Q_{11}$, while its emitter electrode is grounded. A muting pulse is supplied to the base electrode of transistor $Q_{13}$ in response to, for example, the turning on of a power supply switch (not shown).

The operation of the muting circuit is as follows: when a positive muting pulse is supplied to the base electrode of transistor $Q_{13}$, transistor $Q_{13}$ is turned on. Accordingly, the audio signal is bypassed to the ground through transistor $Q_{13}$, rather than being supplied to the base electrode of transistor $Q_{11}$.

At the transient time transistor $Q_{11}$ is turned on, its base potential, however, drops from $I_B R_B$ to zero volts. As a result, a large AC pulsed waveform is produced at output terminal 14 which is thereby supplied to the loudspeaker. This pulsed AC waveform causes the loudspeaker to produce a "pop" sound. $I_B$ is the base current of transistor $Q_{11}$ and $R_B$ is the resistance of resistor $R_{13}$.

In order to prevent the base potential of transistor $Q_{11}$ from dropping, a condenser (not shown) must be connected between the collector electrode of transistor $Q_{13}$ and the terminal of resistor $R_{13}$ which is connected to the base electrode of transistor $Q_{11}$. Since the capacitance of such a condenser must be considerably large, the resulting muting circuit has the disadvantage that it cannot be fabricated into a semiconductor integrated circuit.

SUMMARY OF THE INVENTION

Accordingly, an object of this invention is to provide an improved signal intercepting circuit which does not produce an undesirable AC component during the functioning of the intercepting operation.

Another object of this invention is to provide an intercepting circuit which can be readily fabricated into a semiconductor integrated circuit.

The muting circuit of the present invention comprises a first and second differential amplifier. The first differential amplifier comprises first and second transistors. The base electrode of the first transistor receives an input signal. The second differential amplifier comprises third and fourth transistors. The collector electrode of the third transistor is connected to the collector electrode of the second transistor, while the collector electrode of the fourth transistor is connected to the collector electrode of the first transistor. A switching circuit, receiving an intercepting signal, is coupled to the first and second differential amplifier. In the absence of an intercepting signal, the switching circuit causes the conduction of the first differential amplifier, and while cutting off the second differential amplifier. Upon receiving an intercepting signal, the switching circuit cuts off the first differential amplifier while it causes the conduction of the second differential amplifier. Furthermore, the switching circuit causes the simultaneous conduction of the first and second differential amplifiers during a rising time and falling time of the intercepting signal. A D.C. fluctuation in the output voltage is produced during the time one amplifier is being activated while the other is being cut off. The simultaneous operation of both differential circuits prevents D.C. fluctuations in input voltage supplied to an output transistor. Consequently, the D.C. output potential of an output amplifier does not substantially fluctuate irrespective of the intercepting operation.

The objects and advantages of the present invention will become apparent to persons skilled in the art from a study of the following description of the accompanying drawings.

DESCRIPTION OF THE PREFERRED EMBODIMENT

Figure 1:
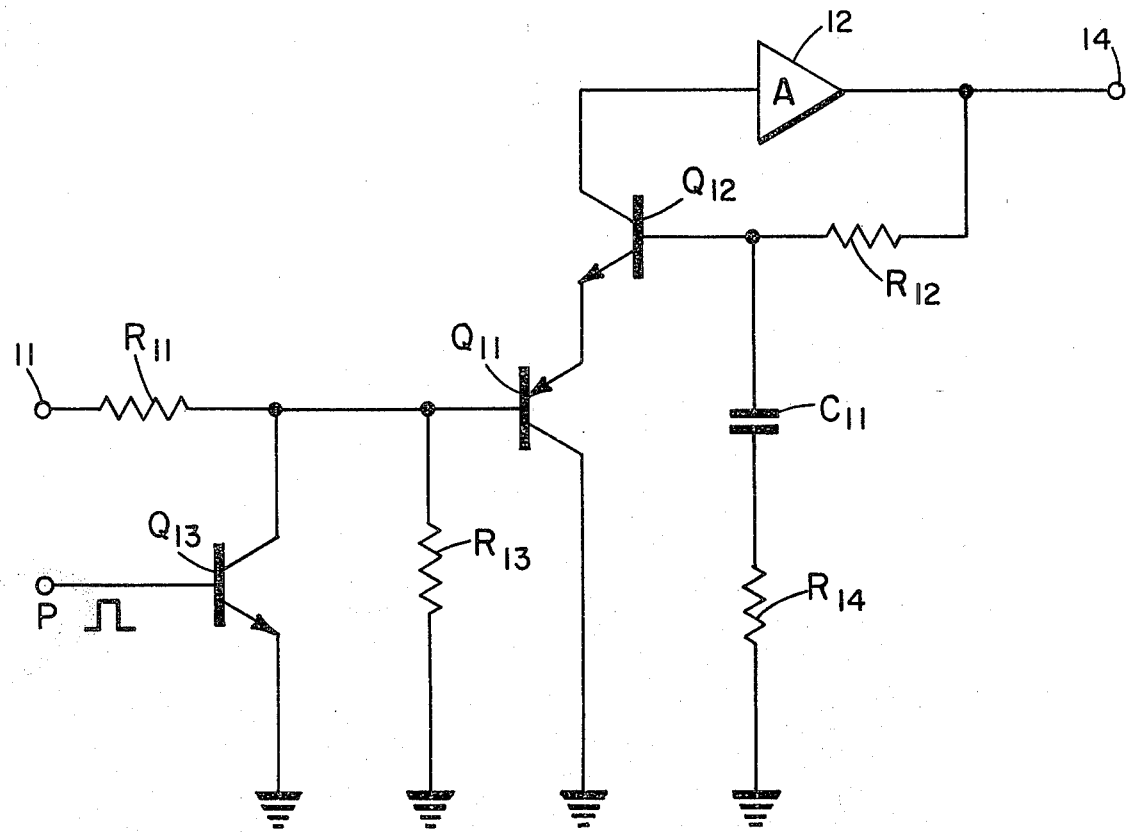
FIG. 1 is a schematic circuit diagram of a muting circuit of the prior art.

The present invention will be described in detail with reference to the accompanying drawings. Throughout the drawings, like reference numerals will be used to designate like or equivalent portions, for simplicity in explanation.

Figure 2:
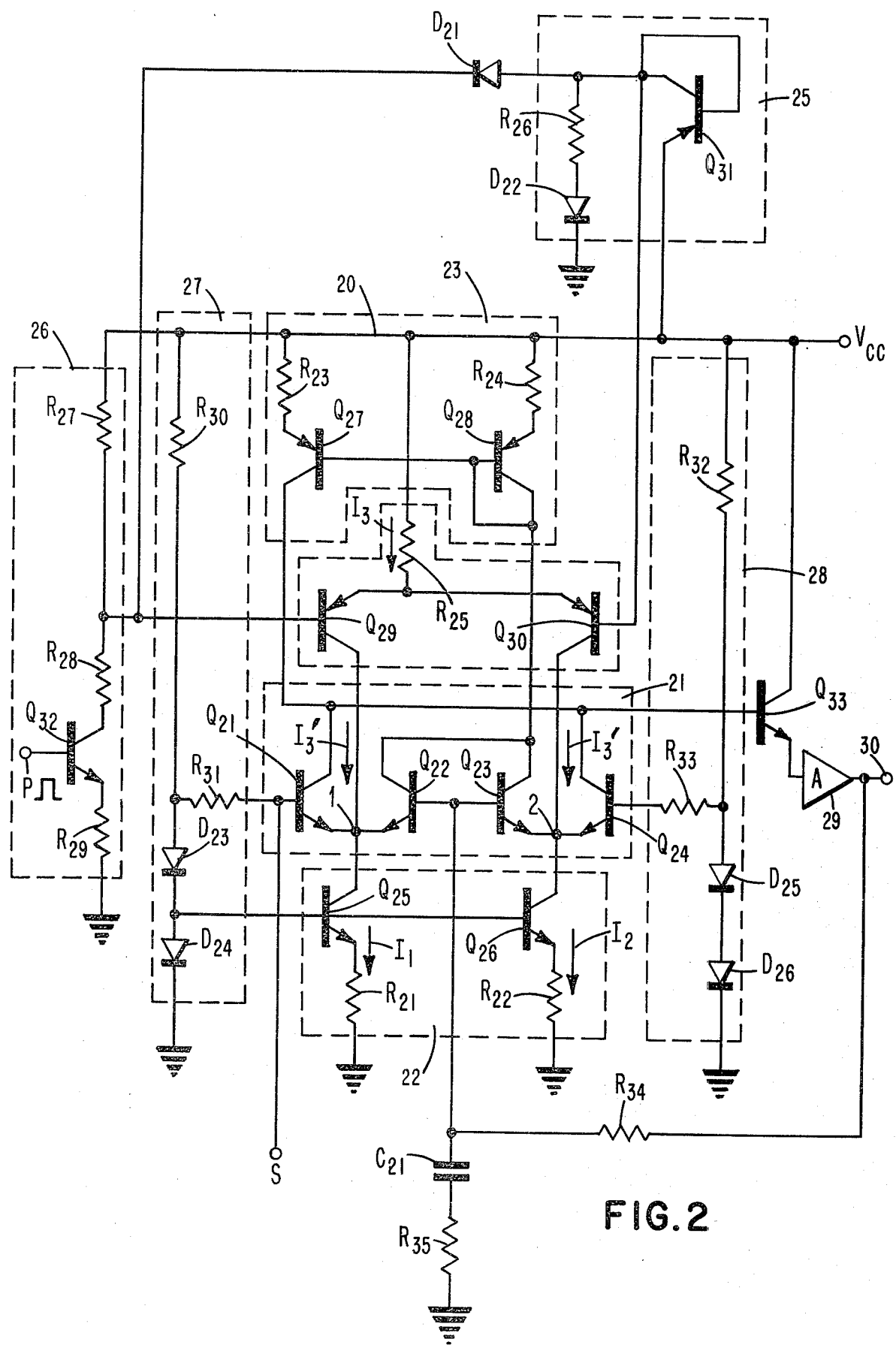
FIG. 2 is a circuit diagram of a muting circuit according to the present invention.

Referring now to FIG. 2, an audio signal S is supplied to the base electrode of a transistor $Q_{21}$. The emitter electrode of transistor $Q_{21}$ is connected to the emitter electrode of a transistor $Q_{22}$. Transistors $Q_{21}$ and $Q_{22}$ constitute a first differential amplifier. The base electrode of a transistor $Q_{23}$ is connected to the base electrode of transistor $Q_{22}$, while its emitter electrode is connected to the emitter electrode of a transistor $Q_{24}$. The collector electrode of transistor $Q_{23}$ is connected to the collector electrode of transistor $Q_{22}$. The collector electrode of transistor $Q_{24}$ is connected to the collector electrode of transistor $Q_{21}$. Transistors $Q_{23}$ and $Q_{24}$ constitute a second differential amplifier which form a doubly balanced differential amplifier 21 together with transistors $Q_{21}$ and $Q_{22}$.

The collector electrode of a transistor $Q_{25}$ is connected to the emitter electrode of transistor $Q_{21}$, while its emitter electrode is grounded through a resistor $R_{21}$. The collector electrode of a transistor $Q_{26}$ is connected to the emitter electrode of transistor $Q_{23}$, while its emitter electrode is grounded through a resistor $R_{22}$. Transistors $Q_{25}$ and $Q_{26}$ constitute a constant current source circuit 22 for transistors $Q_{21}$, $Q_{22}$ and $Q_{23}$, $Q_{24}$.

Resistor $R_{30}$ and diodes $D_{23}$, $D_{24}$ are serially connected between a power supply line 20 and ground. The connection point of resistor $R_{30}$ and diode $D_{23}$ is connected, through a resistor $R_{31}$, to the base electrode of transistor $Q_{21}$. The connection point of diodes $D_{23}$, $D_{24}$ is connected to the base electrodes of transistors $Q_{25}$, $Q_{26}$. Resistors $R_{30}$, $R_{31}$ and diodes $D_{23}$, $D_{24}$ constitute a bias circuit 27 for transistors $Q_{21}$, $Q_{25}$ and $Q_{26}$. Resistor $R_{32}$ and diodes $D_{25}$, $D_{26}$ are serially connected between power supply line 20 and ground. The connection point of resistor $R_{32}$ and diode $D_{25}$ is connected, through a resistor $R_{33}$, to the base electrode of transistor $Q_{24}$. Resistors $R_{32}$, $R_{33}$ and diodes $D_{25}$, $D_{26}$ constitute a bias circuit 38 for transistor $Q_{24}$.

The collector electrode of a transistor $Q_{27}$ is connected to the collector electrode of transistor $Q_{21}$, while its emitter electrode is connected, through a resistor $R_{23}$, to power supply line 20. The collector electrode of a transistor $Q_{28}$ is connected to the collector electrode of transistor $Q_{23}$, while its emitter electrode is connected, through a resistor $R_{24}$, to power supply line 20. The base electrode of transistor $Q_{28}$ is connected to its collector electrode and to the base electrode of transistor $Q_{27}$. Transistors $Q_{27}$ and $Q_{28}$ constitute a current mirror circuit which functions as a load circuit 23 for doubly balanced differential amplifier 21.

The collector electrode of a transistor $Q_{29}$ is connected to the emitter electrode of transistor $Q_{21}$, while its emitter electrode is connected, through a resistor $R_{25}$, to power supply line 20. The collector electrode of a transistor $Q_{30}$ is connected to the emitter electrode of transistor $Q_{23}$, while its emitter electrode is connected to the emitter electrode of transistor $Q_{29}$. Transistors $Q_{29}$, $Q_{30}$ and resistor $R_{25}$ constitute a current supply circuit 24.

The base electrode of transistor $Q_{30}$ is connected to power supply line 20 through a transistor $Q_{31}$, functioning as a diode, and to ground through serially connected resistor $R_{26}$ and diode $D_{22}$. The connection point of transistor $Q_{31}$ and resistor $R_{26}$ is connected, through a diode $D_{21}$, to the base electrode of transistor $Q_{29}$. Transistor $Q_{31}$, resistor $R_{26}$ and diode $D_{22}$ constitute a bias circuit for transistor $Q_{30}$. Diode $D_{21}$ prevents the base potential of transistor $Q_{29}$ from dropping uder a predeterminate value.

The base electrode of transistor $Q_{29}$ is connected, through a resistor $R_{27}$, to power supply line 20 and to the collector electrode of transistor $Q_{32}$ through a resistor $R_{28}$. The emitter electrode of transistor $Q_{32}$ is grounded through a resistor $R_{29}$. Transistor $Q_{32}$ and resistors $R_{27}$, $R_{28}$ and $R_{29}$ constitute an input circuit 26 for receiving a muting pulse P. The muting pulse P is supplied to the base electrode of transistor $Q_{32}$. Circuits 24, 25 and 26 constitute a switching circuit which control the operation of the two differential amplifiers (i.e., $Q_{21}$, $Q_{22}$ and $Q_{23}$, $Q_{24}$) of circuit 21.

The collector electrode of transistor $Q_{21}$ is also connected to the base electrode of a transistor $Q_{33}$. The collector electrode of transistor $Q_{33}$ is connected to power suply line 20, while its emitter electrode is connected, through an amplifier 29, to an output terminal 30. Output terminal 30 is connected to the base electrode of transistors $Q_{22}$ and $Q_{23}$ through a negative feedback resistor $R_{34}$; the base electrodes of transistors $Q_{22}$ and $Q_{23}$ are also grounded through serially connected condenser $C_{21}$ and resistor $R_{35}$.

The operation of the muting circuit will now be described. As shown, it is assumed that $I_1$, $I_2$ and $I_3$ are the values of the constant currents flowing through transistors $Q_{25}$, $Q_{26}$ and resistor $R_{25}$, respectively. Further, the circuit is designed so that the relationship among $I_1$, $I_2$ and $I_3$ is as follows:

$$I_1 < I_3 < I_1 + I_2 \tag{1}$$

$$I_2 < I_3 < I_1 + I_2 \tag{2}$$

During normal operations (i.e., a muting pulse is not supplied to the base electrode of transistor $Q_{32}$), transistor $Q_{30}$ conducts and transistor $Q_{29}$ is cut off. Since transistor $Q_{29}$ is cut off, constant current $I_3$ flowing through resistor $R_{25}$ flows through transistor $Q_{30}$. Except for a small portion of current $I_3$ flowing from the emitter to the base electrode of transistor $Q_{30}$, most of the current (i.e., $I_3'$) flows through the collector electrode of $Q_{30}$ and to the interconnection of the emitter electrodes of transistors $Q_{23}$, $Q_{24}$. Transistor $Q_{30}$ is selected so that the amount of its emitter-base current flow, results in current $I_3'$ being equal to constant current $I_2$. Since $I_3'$ equals $I_2$, no additional current is needed from the emitter electrodes of transistors $Q_{23}$, $Q_{24}$ to supply current to node 2. Consequently, the current supplied from transistors $Q_{23}$, $Q_{24}$ to node 2 is zero; as a result, transistors $Q_{23}$, $Q_{24}$ are forced to cut off. Transistors $Q_{21}$, $Q_{22}$, however, continue to conduct. As a result, audio signal S is amplified by differential transistors $Q_{21}$, $Q_{22}$, transistor $Q_{33}$ and amplifier 29, and then supplied to output terminal 30.

The muting operation will now be described upon application of a muting pulse P to the base electrode of transistor $Q_{32}$. This pulse will generally be supplied when the power supply switch is turned on, or when the band selecting or STEREO MONO selecting switches is changed. In response to muting pulse P, transistor $Q_{32}$ is activated thereby causing conduction of transistor $Q_{29}$, while transistor $Q_{30}$ is cut off. Since transistor $Q_{30}$ is cut off, constant current $I_3$ flows through transistor $Q_{29}$. Except for a small portion of current flowing from the emitter to the base electrode of transistor $Q_{29}$, most of the current (i.e., $I_3'$) flows through the collector electrode of $Q_{29}$ and to the interconnection of the emitter electrodes of transistors $Q_{21}$, $Q_{22}$. Transistor $Q_{29}$ is selected so that the amount of its emitter-base current flow, results in current $I_3'$ being equal to $I_1$. Since $I_3'$ equals $I_1$, no additional current is needed from the emitter electrodes of transistors $Q_{21}$, $Q_{22}$ to supply current to node 1. Consequently, the current supplied from transistors $Q_{21}$, $Q_{22}$ to node 1 is zero; as a result, transistors $Q_{21}$, $Q_{22}$ are forced to cut off. Accordingly, the audio signal S is not supplied to output terminal 30, and the muting operation is achieved. Although transistors $Q_{21}$, $Q_{22}$ are cut off, transistors $Q_{23}$, $Q_{24}$ continue to conduct and supply a constant D.C. voltage to the input terminal of transistor $Q_{33}$. Consequently, the D.C. potential supplied to output terminal 30 does not substantially fluctuate despite the presence or absence of muting.

Further, when transistor $Q_{32}$ receives either the rising or falling edge of muting pulse P, both transistors $Q_{29}$, $Q_{30}$ conduct resulting in constant current $I_3$ flowing through transistors $Q_{29}$, $Q_{30}$. In view of the relation of $I_3 < I_1 + I_2$, additional current is needed from the emitter electrodes of transistors $Q_{21}$, $Q_{22}$ to supply current to node 1 and additional current is needed from the emitter electrodes of transistor $Q_{23}$, $Q_{24}$ to supply current to node 2. Consequently, transistors $Q_{21}$ to $Q_{24}$ conduct to supply the necessary current. The simultaneous operation of both differential amplifier prevents D.C. fluctuations in the input voltage supplied to output transistor $Q_{33}$ during the rising and falling time of pulse P. Consequently, the D.C. potential supplied to output terminal 30 does not substantially fluctuate irrespective of the intercepting operation.

Furthermore, the presence of diode $D_{21}$ between the base electrode of transistor $Q_{29}$ and bias circuit 25, prevents the base potential of transistor $Q_{29}$ from dropping below a predetermined value despite conduction of transistor $Q_{32}$. As a result, an undesirable current is prevented from flowing from the emitter electrode of transistor $Q_{21}$ into the base electrode of transistor $Q_{29}$ via the collector electrode of transistor $Q_{29}$.

The muting circuit of the present invention does not employ a condenser as used in the prior art. Accordingly, it can be easily fabricated into a semiconductor integrated circuit. Further, since the number of transistors connected between power supply line 20 and ground is small, the power supply requirements are small.

Figure 3:
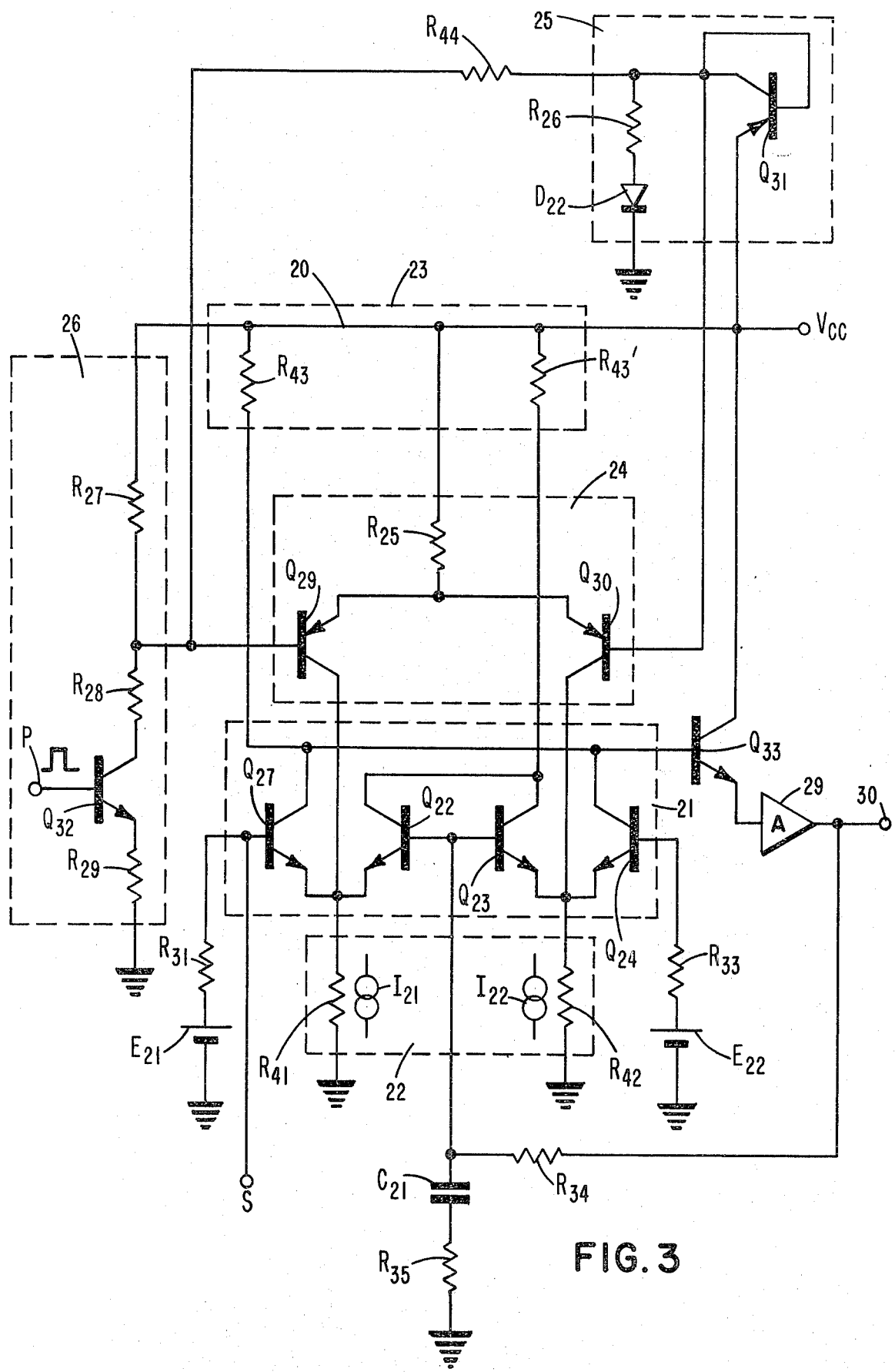
FIG. 3 is a schematic circuit diagram of another embodiment according to the present invention.

The muting circuit shown in FIG. 1 may be modified as shown by the circuit arrangement of FIG. 3. As shown, rather then emplying transistors $Q_{25}$, $Q_{26}$ (see FIG. 2), constant current source circuit 22 can consist of either resistors $R_{41}$, $R_{42}$ having a high resistance, or constant current sources $I_{21}$, $I_{22}$. Rather than employing current mirror circuit $Q_{27}$, $Q_{28}$ (FIG. 2), load circuit 23 consists of resistors $R_{43}$, $R_{43}'$ respectively connected between power supply line 20 and the collector electrodes of transistor $Q_{21}$, $Q_{23}$. Further, rather than employing bias circuits 27, 28 (FIG. 2), reference voltage sources $E_{21}$ and $E_{22}$ are respectively employed.

Although illustrative embodiments of the invention have been described in detail with reference to the accompanying drawings, it is to be understood that the invention is not limited to those precise embodiments and that various changes and modifications may be effected therein by one skilled in the art without departing from the scope or spirit of the invention.

What is claimed is:

1. A signal intercepting circuit for receiving an intercepting signal having a rising edge and a falling edge, said rising edge occurring during a rising time period and said falling edge occurring during a falling time period, comprising:
    a first differential amplifier comprising first and second transistors, the base electrode of said first transistor receiving an input signal;
    a second differential amplifier comprising third and fourth transistors, the collector electrode of said third transistor being connected to the collector electrode of said second transistor, and the collector electrode of said fourth transistor being connected to the collector electrode of said first transistor;
    switching means coupled to said first and second differential amplifier and responsive to said intercepting signal, for switching off said first differential amplifier and switching on said second differential amplifier, said switching means comprising sensing means for sensing the absence of said intercepting signal and switching on said first differential amplifier and switching off said second differential amplifier, said switching means further comprising means for simultaneously switching on said first and second differential amplifiers during said rising time period and said falling time period;
    and, an output terminal coupled to said first differential amplifier.

2. The signal intercepting circuit of claim 1 further comprising:
    a first constant current source circuit coupled to the emitter electrodes of said first and second transistors; and,
    a second constant current source circuit coupled to the emitter electrodes of said third and fourth transistors.

3. The signal intercepting circuit of claim 2 wherein said switching means comprises current supply means coupled to said sensing means for supplying a constant current to the emitter electrodes of said third and fourth transistors during the absence of said intercepting signal, to the emitter electrodes of said first and second transistors during the presence of said intercepting signal, and, to the emitter electrodes of said first, second, third and fourth transistors during said rising time period and said falling time period of said intercepting signal.

* * * * *